(12) United States Patent
Chen

(10) Patent No.: US 7,654,816 B2
(45) Date of Patent: Feb. 2, 2010

(54) LITHOGRAPHIC MASK ALIGNMENT

(75) Inventor: Yong Chen, Sherman Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 940 days.

(21) Appl. No.: 10/960,731

(22) Filed: Oct. 7, 2004

(65) Prior Publication Data

US 2006/0078807 A1    Apr. 13, 2006

(51) Int. Cl.
*B29C 59/00* (2006.01)
(52) U.S. Cl. .................. 425/385; 356/490; 264/293
(58) Field of Classification Search ........... 425/385; 356/490; 264/293
See application file for complete search history.

(56) References Cited

U.S. PATENT DOCUMENTS

| | | | |
|---|---|---|---|
| 4,654,581 A | 3/1987 | Neukermans et al. | |
| 5,130,660 A * | 7/1992 | Flint et al. | 324/662 |
| 5,772,905 A | 6/1998 | Chou | |
| 5,817,242 A | 10/1998 | Biebuyck et al. | |
| 7,070,405 B2 * | 7/2006 | Sreenivasan et al. | 425/174.4 |
| 2002/0042027 A1 | 4/2002 | Chou et al. | |
| 2002/0115002 A1 | 8/2002 | Bailey et al. | |
| 2006/0057240 A1 * | 3/2006 | Koinuma et al. | 425/223 |

FOREIGN PATENT DOCUMENTS

| | | | |
|---|---|---|---|
| JP | 2002-335062 | * | 11/2002 |
| WO | WO 02/067055 A2 | | 8/2002 |

OTHER PUBLICATIONS

Patent Abstracts of Japan—Method for Manufacturing Printed Circuit Board—vol. 2003 No. 03—May 5, 2003—Mitsubishi Paper Mills Ltd .

* cited by examiner

*Primary Examiner*—Maria Veronica D Ewald

(57) ABSTRACT

Systems and methods of aligning a lithographic mask are described. In one aspect, a substrate and a lithographic mask are aligned based at least in part on a motive force between a substrate alignment mark on the substrate and a mask alignment mark on the lithographic mask that induces movement of at least one of the substrate and the lithographic mask into mutual alignment.

24 Claims, 7 Drawing Sheets

LITHOGRAPHIC MASK ALIGNMENT

BACKGROUND

Many different lithographic methods have been proposed for producing patterns on a surface. For example, optical lithographic techniques commonly are used in the fabrication of integrated circuits. Optical lithography is the process of transferring patterns of geometric shapes from a mask to a thin layer of radiation-sensitive material (e.g., photoresist) covering a surface (e.g., a semiconductor substrate). In general, optical lithography involves depositing a layer of photoresist on a surface, selectively exposing the photoresist to ultraviolet light through a mask, and selectively removing the exposed (or unexposed) photoresist regions. The resulting patterned resist structure may be processed to transfer (e.g., by etching) the pattern to an underlying layer or to transfer (e.g., by a lift-off process) the pattern to an overlying layer deposited over the patterned resist structure. Current optical exposure tools typically are capable of a resolution of approximately 0.1-1 µm and a registration of approximately 0.5 µm.

Other lithographic techniques have been developed to improve the resolution and registration limitations of optical lithography. For example, x-ray lithography has a resolution of about 0.5 µm (micrometers), or better, and a registration of about 0.5 µm. Ion beam lithography is capable of a resolution on the order of 10 nm (nanometers). Imprint lithography is a non-radiation based lithography technique in which surfaces are modified by contact with a master pattern. The master pattern may lithographic mask the surface directly or it may initiate chemical reactions on a surface. Imprint lithography may be used to create ultra-fine (sub-25 nm) patterns in a thin film.

Referring to FIGS. 1A-1D, U.S. Pat. No. 5,772,905 describes an imprint lithographic process for creating ultra-fine (sub-25 nm) patterns in a thin film 6 that is disposed on a substrate 8. In accordance with this process, a lithographic mask 10 includes a body 12 and a lithographic masking layer 14 that includes a plurality of exposed protruding features 16. In operation, lithographic mask 10 is pressed into thin film 6 to form a relief pattern (FIG. 1B). In one embodiment, features 16 are not pressed all the way into thin film 6 and, consequently, features 16 do not contact substrate 8. After the lithographic mask is removed, thin film 6 has a relief pattern that consists of compressed (or thinned) regions 18 and uncompressed regions 20 (FIG. 1C). Thin film layer 6 may be further processed (e.g., by etching) to expose substrate regions 22 underlying compressed regions 18 of thin film 6 (FIG. 1D). The resulting patterns in thin film 6 may be transferred (e.g., by lift-off processing) to a material that is deposited onto substrate 8. Alternatively, the patterns in thin film 6 may be transferred (e.g., by etching) directly into substrate 8.

As shown in FIG. 2, U.S. Pat. No. 5,772,905 further discloses an alignment system 24 that may be used to align lithographic mask 10 with respect to film 6. Alignment system 24 includes a stationary block 26 supporting substrate 8 and a moveable lithographic masking block 28 carrying lithographic mask 10. A controller 30 controls the operation of an X-Y positioner 32 that is configured to move lithographic masking block 28 in a plane parallel to the supporting surface of stationary block 26, and a Z positioner 34 that is configured to move lithographic masking block 28 in a direction that is orthogonal to the supporting surface of stationary block 26. An alignment mark 36 is carried by lithographic mask 10 and a complementary mark 38 is carried by substrate 18. A sensor 40 on moveable lithographic masking block 28 is coupled to alignment marks 36 and 38. Sensor 40 is configured to provide an alignment signal 42 to controller 30. In one embodiment, sensor 40 is an optical detector and alignment marks 36, 38 are configured to generate a moiré alignment pattern that enables moiré alignment techniques to be used to align lithographic mask 10 with respect to thin film 6. In another embodiment, alignment marks 36, 38 are formed from electrically conducting material, and sensor 40 is configured to detect the capacitance between alignment marks 36, 38. In this embodiment, lithographic mask 10 may be aligned with respect to thin film 6 by moving moveable lithographic masking block 28 until the capacitance between alignment marks 36, 38 is maximized.

SUMMARY

The invention features systems and methods of aligning a lithographic mask.

In one aspect of the invention, a substrate and a lithographic mask are aligned based at least in part on a motive force between a substrate alignment mark on the substrate and a mask alignment mark on the lithographic mask that induces movement of at least one of the substrate and the lithographic mask into mutual alignment.

In another aspect, the invention features a lithographic system that includes a capacitive coupling based alignment system. The alignment system is configured to generate between a substrate alignment mark on a substrate and a mask alignment mark on a lithographic mask a motive force that induces movement of at least one of the substrate and the lithographic mask into mutual alignment.

In another aspect, the invention features a lithographic system that includes a lithographic mask. The lithographic mask includes a surface relief pattern exposed for imprinting a corresponding surface relief pattern into a thin film on a substrate. The lithographic mask also includes first and second alignment marks. The first alignment mark includes an electrically conducting element having a capacitive coupling region arranged for capacitive coupling with a corresponding alignment mark on the substrate. The second alignment mark includes an electrically conducting element having a capacitive coupling region arranged for capacitive coupling with a corresponding alignment mark on the substrate. The capacitive coupling region of the first alignment mark is larger than the capacitive coupling region of the second alignment mark.

In another aspect of the invention, a lithographic system includes a lithographic mask comprising a surface relief pattern exposed for imprinting a corresponding surface relief pattern into a thin film on a substrate, and at least one magnetically polarized alignment mark.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1A:
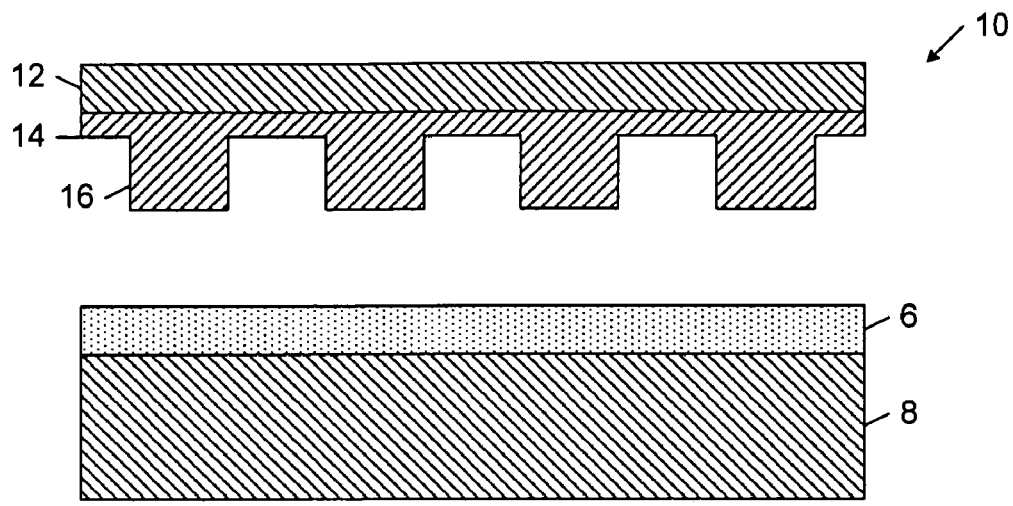
FIG. 1A is a diagrammatic cross-sectional side view of a lithographic mask and a moldable thin film disposed on a substrate in a prior art lithographic imprint process.
Figure 1B:
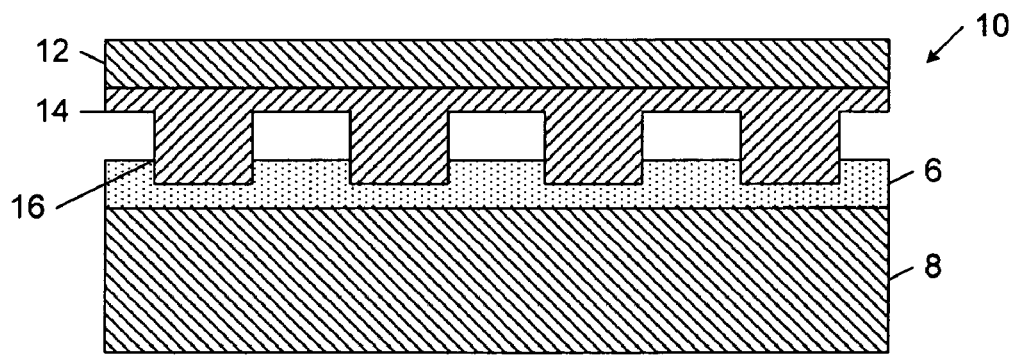
FIG. 1B is a diagrammatic cross-sectional side view of the lithographic mask of FIG. 1A pressed into the thin film.
Figure 1C:
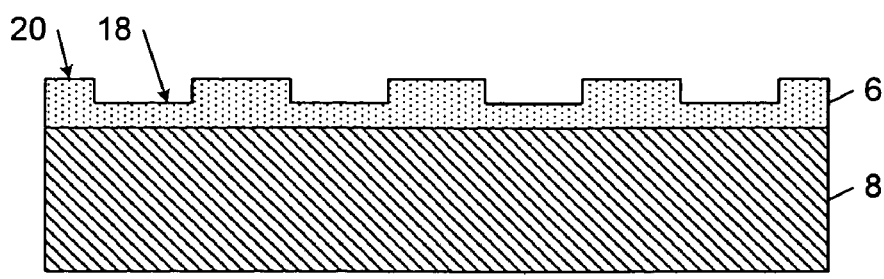
FIG. 1C is a diagrammatic cross-section side view of the thin film of FIG. 1A carrying a relief pattern.
Figure 1D:
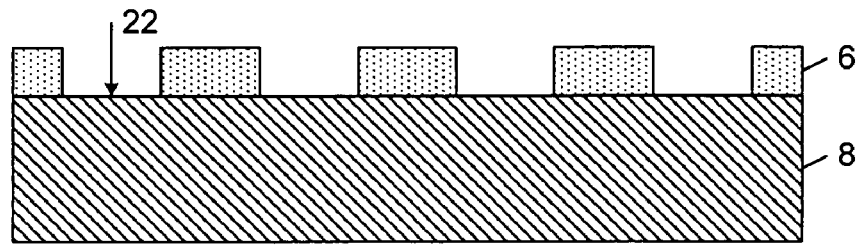
FIG. 1D is a diagrammatic cross-sectional side view of the patterned thin film of FIG. 1C after thinned regions have been removed to expose underlying regions of the substrate.
Figure 2:
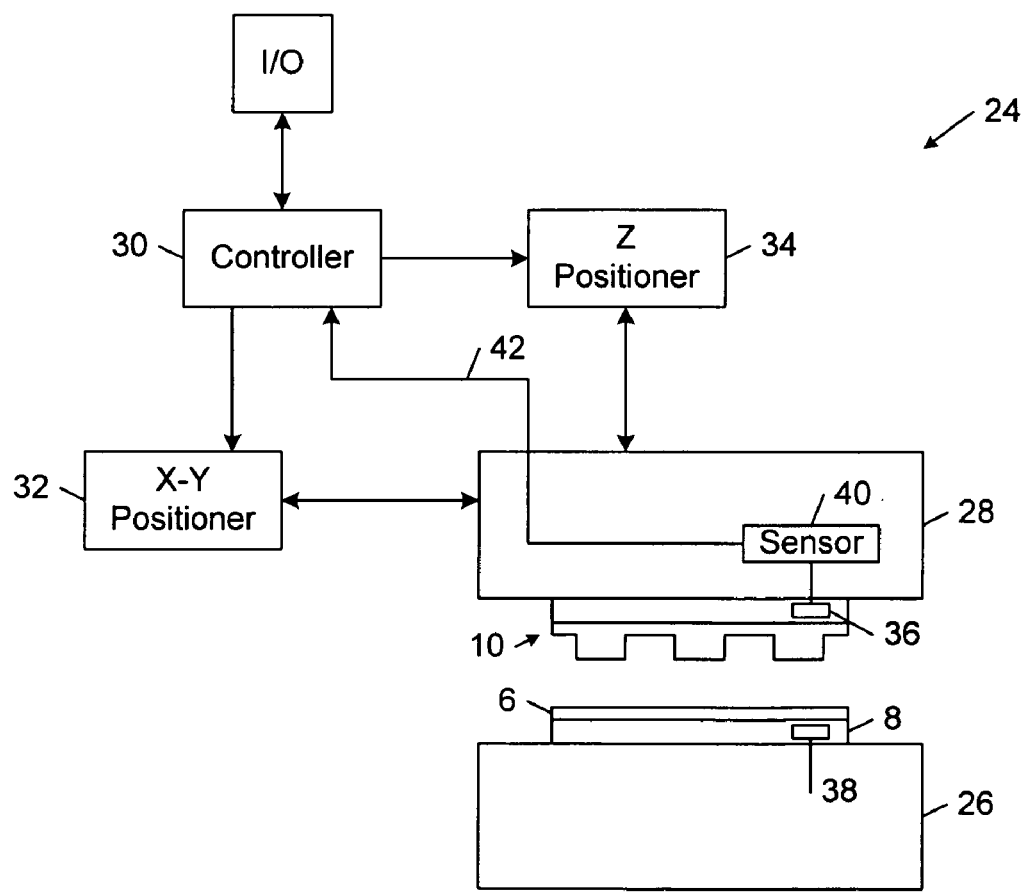
FIG. 2 is a block diagram of a prior art lithographic system.
Figure 3:
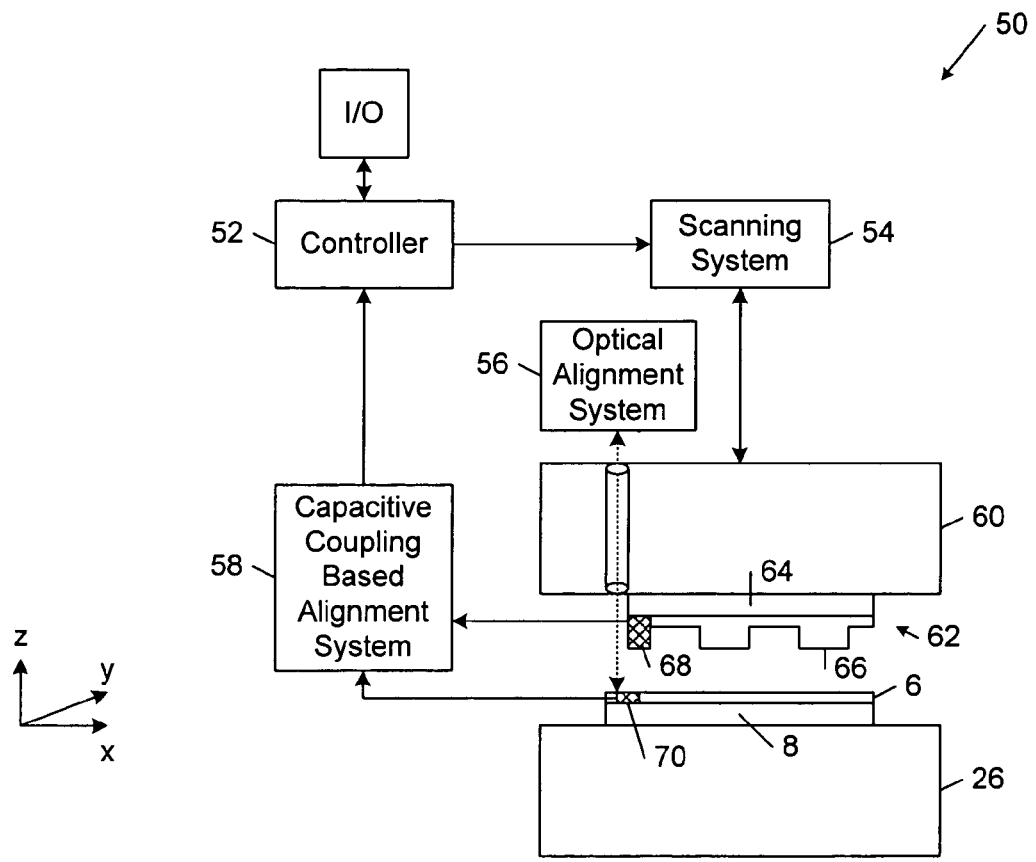
FIG. 3 is a block diagram of an embodiment of a lithographic system that includes a capacitive coupling based alignment system.

Referring to FIG. 3, in one embodiment, a lithographic system 50 includes a controller 52, a scanning system 54, an optical alignment system 56, and a capacitive coupling based alignment system 58. Controller 52 is configured to control the operation of scanning system 54. Controller 52 is not limited to any particular hardware, firmware or software configuration, but rather it may be implemented in any computing or processing environment. For example, controller 52 may be implemented in a high-level procedural or object oriented programming language, or in assembly or machine language; in any case, the programming language may be a compiled or interpreted language.

Scanning system 54 is configured to move a scanning head 60 precisely in a plane (i.e., the x-y plane) that is parallel to the support surface of stationary block 26. Scanning system 54 also is configured to move scanning head 60 precisely in a direction (i.e., the z-direction) that is orthogonal to the support surface of stationary block 26. Scanning head 60 is configured to carry a lithographic mask 62 that includes a body 64 supporting a plurality of protruding features 66 of a relief pattern and at least one mask alignment mark 68. In one embodiment, scanning head 60 may be moved vertically by a z-axis scan actuator and may be moved horizontally by a separate x-y axis scan actuator. The z-axis scan actuator and the x-y axis scan actuator both may be carried on scanning head 60. In one embodiment, the z-axis scan actuator and the x-y axis scan actuator may incorporate one or more of the planar electrostatic actuators described in U.S. Pat. Nos. 6,136,208 and 5,801,472, which are incorporated herein by reference.

Optical alignment system 56 is configured to transmit position reference signals to controller 52 based upon light received from the surface of substrate 8. For example, in one embodiment, optical alignment system 56 may include a sensor that is configured to detect a moiré alignment pattern generated from suitably configured optical alignment marks carried on substrate 8. In this embodiment, any one of a wide variety of moiré alignment techniques may be used by controller 52 to move lithographic mask 62 into coarse (or rough) alignment with respect to the one or more optical alignment marks (not shown) that are carried on substrate 8. Other embodiments may employ different optical techniques (e.g., direct visual observation) to roughly align lithographic mask 62 with respect to the one or more optical alignment marks that are carried on substrate 8.

As explained above, lithographic mask 62 may be aligned to an atomic accuracy (e.g., on the order of 10 nm or less) based upon the generation of a motive force between at least one pair of alignment marks respectively located on the substrate 8 and the lithographic mask 62. In the illustrated embodiments, the motive force induces the substrate to move into mutual alignment with the lithographic mask. In particular, the motive force causes the alignments marks of each pair to line up in registered contact. The alignment accuracy between the lithographic mask 62 and the features on substrate 8 roughly corresponds to the dimensions with which the mask alignment marks 68 and the substrate alignment marks 70 are formed. In some embodiments, the alignment marks 68 are formed on lithographic mask 62 using standard lithographic techniques that can achieve alignment mark dimensions down to about 10 nm. The substrate alignment marks 70 may be formed using similarly constructed lithographic masks. In this way, the features on substrate 8 may be aligned with the features of lithographic mask 62 within an alignment tolerance range on the order of about ±5 nm or less.

Referring to FIGS. 4 and 5A-5E, in one embodiment, substrate 8 may be lithographically processed as follows.

Figure 4:
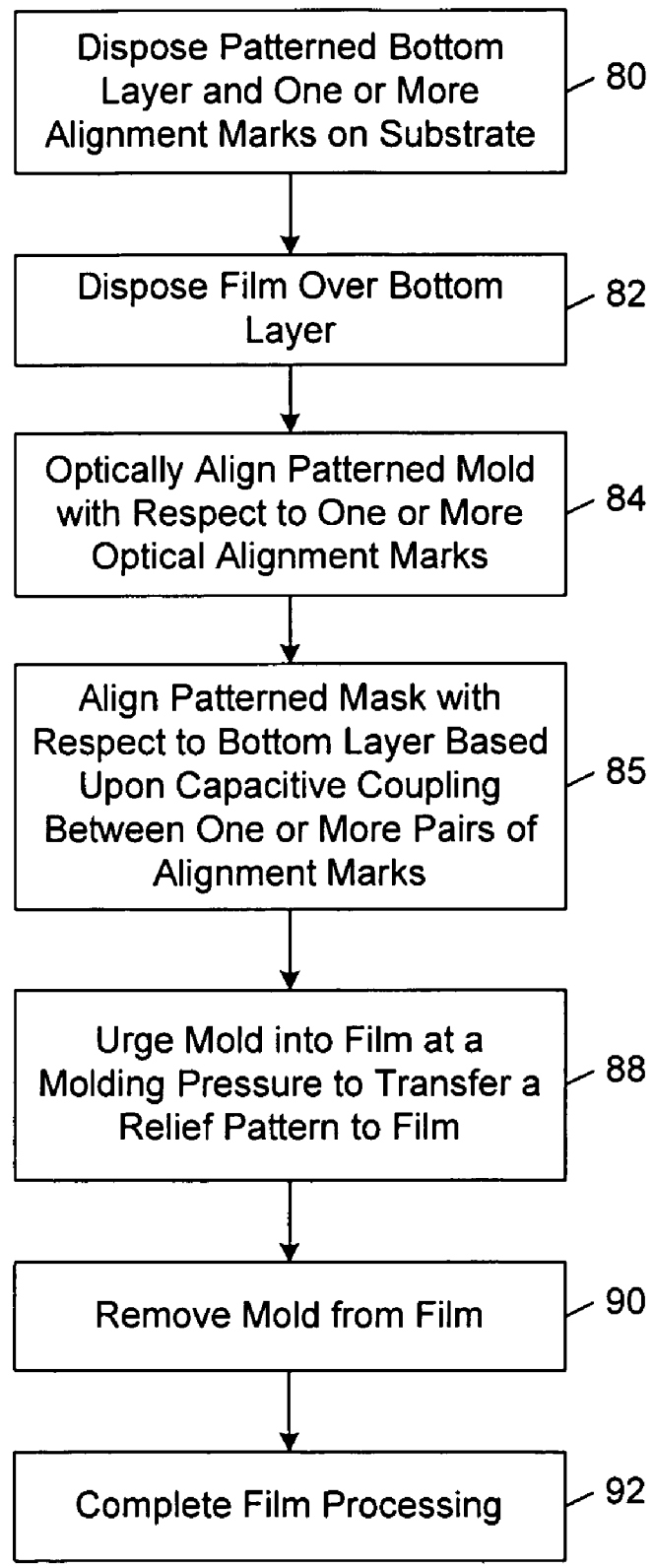
FIG. 4 is a flow diagram of an embodiment of a lithographic method that includes mask alignment and moldable film patterning steps performed by the lithographic system of FIG. 3.
Figure 5A:
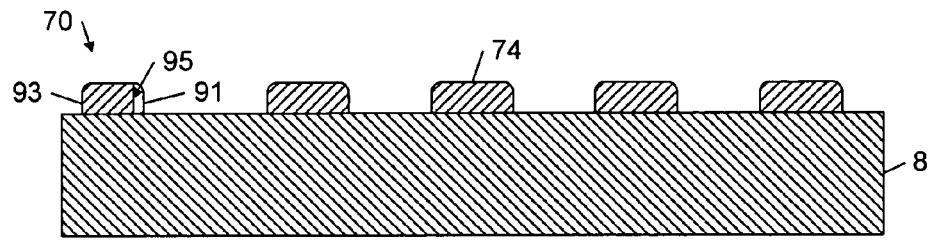
FIG. 5A is a diagrammatic cross-sectional side view of an embodiment of a substrate supporting a patterned bottom layer and a substrate alignment mark.

Referring initially to FIGS. 4 and 5A, a patterned bottom layer 74 and one or more alignment marks 70 are disposed on the substrate 8 (step 80). As used herein, the term "substrate" refers broadly to any supporting structure. The supporting structure may, for example, include a base support, such as a semiconductor wafer or chip, and possibly one or more layers, devices, or structures formed on the base support. In one embodiment, the bottom layer 74 may be a wire layer consisting of a plurality of electrically conducting wires. The alignment marks 70 may be formed from electrically conducting elements 93, each of which is formed of electrically conductive material (e.g., aluminum or titanium) that is patterned to have one or more selected geometric shapes. The alignment marks 70 also respectively include insulating layers 91 disposed over respective capacitive coupling regions 93. The electrically conductive elements 93 of the alignment marks 70 may be connected electrically to capacitive coupling alignment system 58 through respective electrically conducting wires and respective bonding pads that are carried on substrate 8.

Figure 5B:
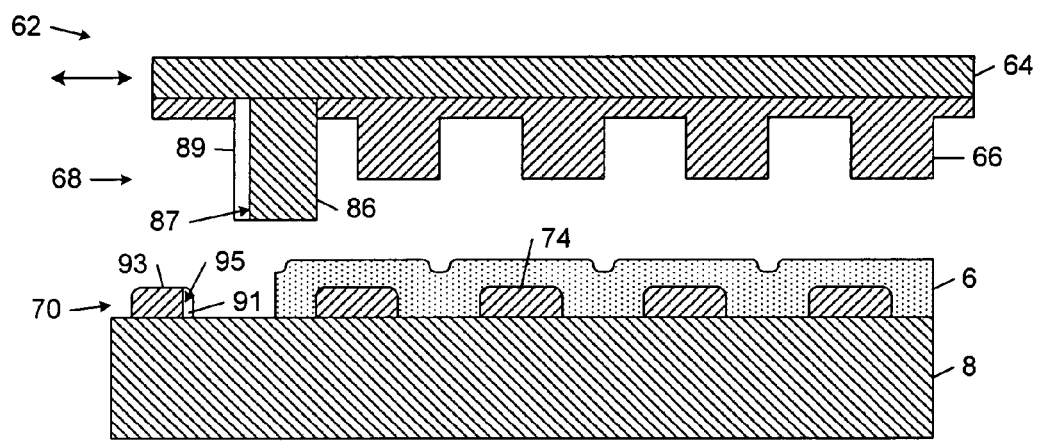
FIG. 5B is a diagrammatic cross-sectional side view of an embodiment of a patterned lithographic mask carrying a mask alignment mark, and the substrate of FIG. 5A with a thin film disposed over the patterned bottom layer.

Referring to FIG. 5B, a moldable thin film 6 is disposed over the patterned bottom layer 74, but not over the one or more alignment marks 70 (step 82; FIG. 4). In one embodiment, the film 6 includes a thermoplastic polymer (e.g., polymethyl methacrylate (PMMA)). THe patterned lithographic mask 62 is moved into relatively coarse alignment (e.g., a sub-micrometer accuracy on the order of about 500 nm) with respect to the one or more optical alignment marks 76 (step 84; FIG. 4). As mentioned above, the patterned lithographic mask 62 may be coarsely aligned in accordance with a moiré pattern optical alignment technique. The patterned lithographic mask 62 then is aligned with greater accuracy based upon capacitive coupling between one or more of the alignment marks 68 on mask 62 with one or more respective alignment marks 70 on substrate 8 (step 85; FIG. 4).

In the illustrated embodiment, each mask alignment mark 68 includes an electrically conductive element 86 that has a capacitive coupling region 87 that is arranged for capacitive coupling with a corresponding alignment mark 70 on the substrate. Similarly, each substrate alignment mark 70 includes an electrically conductive element 93 that has a capacitive coupling region 95 that is arranged for capacitive coupling with a corresponding alignment mark 68 on the lithographic mask 62. At least one of the mask alignment mark 68 and the substrate alignment mark 70 also includes a respective electrically insulating layer 89, 91. The mask alignment mark 68 and the substrate alignment mark 70 are capacitively coupled together by applying an electric potential across the mask alignment mark 68 and the substrate alignment mark 70. The term "capacitive coupling" refers broadly to the attractive or motive force generated by accumulation of oppositely polarized charge at the capacitive coupling regions of the mask alignment mark 68 and the substrate alignment mark 70. The motive force induces at least one of the lithographic mask 62 and the substrate 8 to move into mutual alignment. The capacitive coupling regions 87, 95 correspond to the surface regions of the electrically conductive elements 86, 93 that oppose or face one another to form a capacitor structure (i.e., a pair of electrical conductors separated by an electrical insulator) when the mask alignment mark 68 and the substrate alignment mark 70 are brought into contacting alignment. The electrically insulating layers 89, 91 prevent the mask alignment mark 68 and the substrate alignment mark 70 from being electrically connected together when they are brought into contact during the capacitive coupling alignment process. In some implementations, the electrically insulating layers 89, 91 completely cover the electrically conductive elements 86, 93 of the mask alignment mark 68 and the substrate alignment mark 70, rather than only cover the capacitive coupling regions 87, 95 as in the illustrated embodiments.

Assuming the overlapping face-to-face capacitive coupling areas of the mask alignment mark 68 and the substrate alignment mark 70 is A and the distance between the alignment marks 68, 70 is d, the energy stored between the mask alignment mark 68 and the substrate alignment mark 70 is $C \cdot V^2$, where $C = \epsilon_0 \epsilon \cdot A/d$ is the capacitance between the two alignment marks 68, 70, and $\epsilon_0$ and $\epsilon$ are, respectively, the permittivity of vacuum and the effective permittivity of the materials between the two alignment marks 68, 70. The motive force f between the alignment marks 68, 70 is given by $f = C V^2/d$. In some implementations, the force f between the alignment marks 68, 70 may be approximated by $f \approx 10^{-11} V^2 A/d^2$, where f, V, A, and d are in the units of Newton, volt, and $nm^2$, and nm, respectively. To align the mask 62 and the substrate 8, the force f should be greater than the frictional force between the substrate and the lithographic mask that resists movement of at least one of the substrate and the lithographic mask into mutual alignment. To this end, V and A may be increased and d may be decreased. In the illustrated embodiments, the value d typically is determined by the coarse, pre-alignment accuracy of the optical alignment system 56. In some cases, the value of d may be reduced further by controlled or random movement of the mask 62 with respect to the substrate. In some implementations, d can be reduced down to 10-100 nm. To increase the effective capacitive coupling area (A), the length and depth of the capacitive coupling regions may be increased and/or multiple alignment mark pairs 62, 70 may be used. If A is on the order of $mm^2$ and d has a value 10-100 nm, the motive force, f, is on the order of Newtons and, therefore, is likely to overcome the movement resisting frictional forces in many implementations.

During the capacitive coupling process, the controller 52 may disengage a clutch or other similar mechanism in scanning system 54 to allow the scanning head 60 to move substantially freely at least over a limited areal range in the vicinity of the coarse alignment position in the x-y plane. This allows the lithographic mask 62 to move into mutual alignment with substrate 8 under the guidance of the motive force between the mask alignment mark 68 and the substrate alignment mark 70.

Figure 5C:
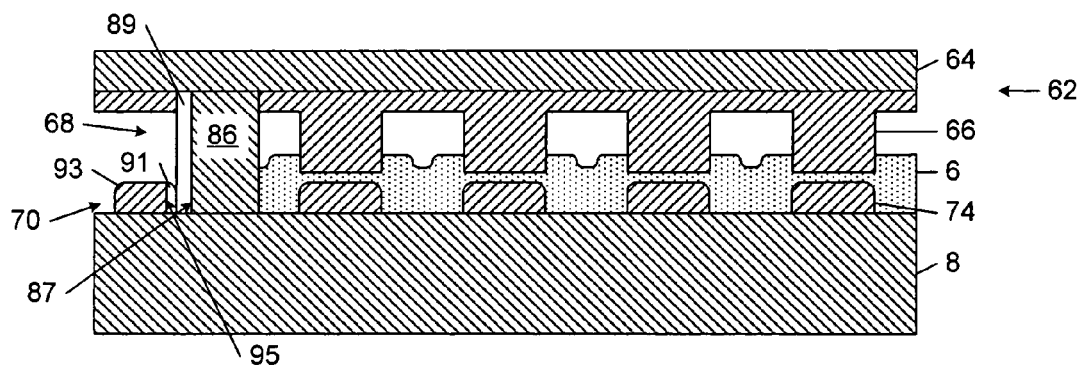
FIG. 5C is a diagrammatic cross-sectional side view of the patterned lithographic mask of FIG. 5B pressed into the thin film to transfer a relief pattern to the thin film.

Referring to FIG. 5C, during or after the process of aligning the patterned lithographic mask 62 (steps 84 and 85; FIG. 4), the lithographic mask 62 is urged into the film 6 at a molding pressure that is sufficient to transfer a relief pattern to the film 6 (step 88; FIG. 4). In some implementations, the mask alignment marks 68 are projectable from and retractable toward the base 64 of lithographic mask 62. For example, each mask alignment mark 68 may be mounted on a piezoelectric element (e.g., a piezo actuator) that controller 52 may selectively move toward and away from the base 64. In these embodiments, the mask alignment marks 68 may be projected toward the substrate 8 during the capacitive coupling alignment step (step 85; FIG. 4) and may be retracted away from the substrate before the lithographic mask 62 is urged into the film 6 (step 88; FIG. 4). During this compressive molding step, the film 6 may be heated to a temperature at which the film 6 is sufficiently softened relative to the hardness of the mold 62 so that the film 6 may conform to the protruding features 66 of the mold 62. For example, in one embodiment, the film 6 may be heated to a temperature that is at or above the glass transition temperature of the film 6.

Figure 5D:
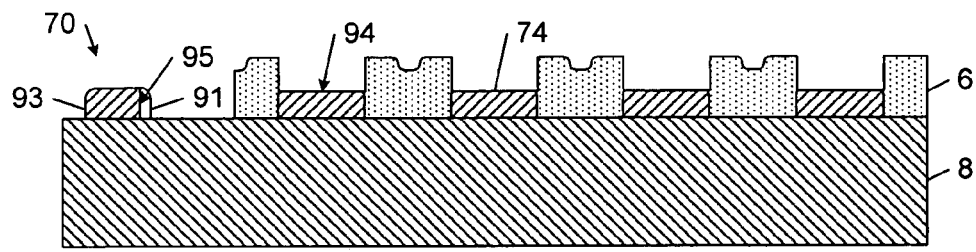
FIG. 5D is a diagrammatic cross-sectional side view of the patterned thin film of FIG. 5C with thinned regions removed to expose underlying regions of the substrate.

Referring to FIG. 5D, after the relief pattern has been transferred to the film 6 (step 88; FIG. 4), the mold 62 is removed from the film 6 (step 90; FIG. 4). The patterned film 6 then may be further processed (step 92; FIG. 4). For example, in one embodiment, thinned regions 18 of the patterned film 6 may be removed (e.g., by etching) to expose underlying regions 94 of the bottom layer (or the substrate).

Figure 5E:
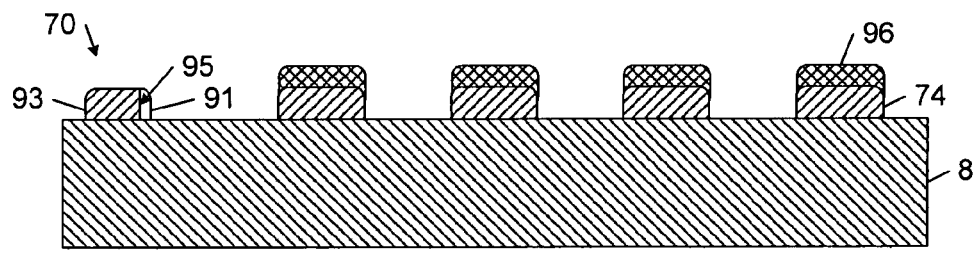
FIG. 5E is a diagrammatic cross-sectional side view of the substrate of FIG. 5A after the thin film pattern of FIG. 5D was transferred to an overlying top layer by a lift-off process.

As shown in FIG. 5E, in one embodiment, the resulting patterns in the film 6 may be transferred (e.g., by lift-off processing) to a material 96 that is subsequently deposited on substrate 8. In another embodiment, the resulting patterns in the film 6 may be transferred (e.g., by etching) directly into substrate 8.

In some embodiments, the capacitive coupling alignment process (step 85; FIG. 4) proceeds in stages. In a first stage, the lithographic mask 62 and the substrate 8 are aligned by capacitively coupling respective alignment marks having capacitive coupling regions with respective areas within a first areal value range (e.g., $t \cdot l_1$ to $t \cdot l_2$, where t is the common thickness dimension of the capacitive coupling regions and $l_1$ and $l_2$ are length dimensions in the range of about 100 nm to about 500 nm) corresponding to a first alignment accuracy. In a second stage, the lithographic mask 62 and the substrate 8 are aligned by capacitively coupling respective alignment marks having capacitive coupling regions with respective areas within a second areal value range (e.g., $t \cdot l_3$ to $t \cdot l_4$, where t is the common thickness dimension of the capacitive coupling regions and $l_3$ and $l_4$ are length dimensions in the range of about 50 nm to about 100 nm) corresponding to a second alignment accuracy that is greater than the first alignment accuracy. In some implementations, the capacitive coupling regions of the first set of alignment marks are larger than the capacitive coupling regions of the second set of alignment marks by a factor of at least 1.5. In some of these implementations, the capacitive coupling regions of the first set of alignment marks is larger than the capacitive coupling regions of the second alignment marks by a factor of at least 10. Additional alignment stages may be performed, each stage involving capacitively coupling of respective sets of alignment mark pairs having capacitive coupling regions with progressively smaller areal values, until a prescribed final alignment accuracy is achieved.

Figure 6:
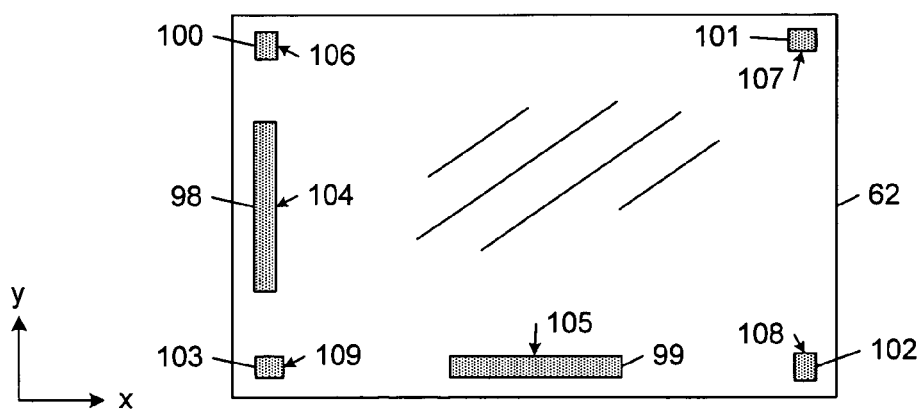
FIG. 6 is a diagrammatic top view of an embodiment of a mask that includes two sets of alignment marks sized for different alignment accuracy ranges.

FIG. 6 shows an embodiment of a lithographic mask 62 that includes a first set of alignment marks 98, 99 and a second set of alignment marks 100, 101, 102, 103. In this embodiment, the capacitive coupling regions of the alignment marks of the first set are electrically connected together, and the capacitive coupling regions of the alignment marks of the second set are electrically connected together. The capacitive coupling regions of the alignment marks of the first set, however, are electrically disconnected from the capacitive coupling regions of the alignment marks of the second set. Each alignment mark 98-103 includes a respective electrically conducting element having a capacitive coupling region 104, 105, 106, 107, 108, 109 arranged for capacitive coupling with a corresponding alignment mark on the substrate 8, as described above. In the illustrated embodiment, the capacitive coupling regions 104, 105 of the alignment marks 98, 99 of the first set have respective capacitive coupling areas within a first areal value range, and the capacitive coupling regions 106-109 of the alignment marks 100-103 of the second set have respective capacitive coupling areas within a second areal value range that is different from the first areal value range. The alignment marks of each set are disposed on different orthogonal edges of lithographic mask 62 to enable precise alignment of lithographic mask 62 in the x-y plane, which is parallel to the exposed support surface of stationary block 26.

The above-described imprinting lithographic process may be used to fabricate a wide variety of different nano-scale devices.

Figure 7:
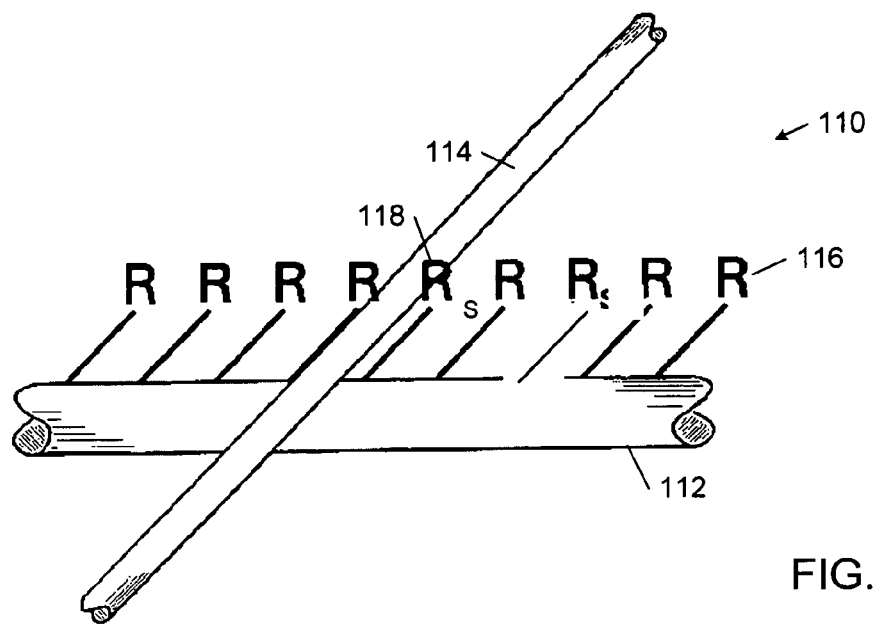
FIG. 7 is a diagrammatic perspective representation of an embodiment of a molecular electronic device formed from at least one electrically addressable molecular species that is sandwiched between two crossed electrically conductive wires.

Referring to FIG. 7, in some embodiments, the above-described lithographic process may be used to fabricate a molecular electronic device 110 that includes two electrically conducting wires 112, 114 that are crossed at a non-zero angle, and a layer of bi-stable molecules or molecular compounds 116 (denoted by the symbol R) that is sandwiched between wires 112, 114. In particular, molecular electronic device 110 may be fabricated as described in U.S. Pat. Nos. 6,542,400 and 6,541,309, both of which are by Yong Chen and assigned to Hewlett-Packard Company of Palo Alto, Calif., U.S.A., and are incorporated herein by reference. However, in these embodiments, electrically conducting wires 112, 114 may be patterned and aligned in accordance with the above-described imprint lithography process.

Each wire 112, 114 may be formed from a metal or a doped semiconductor material. The particular molecule or molecules 18 (denoted by the symbol $R_S$) that are located at the intersection (or junction) of wires 112, 114 act as switch molecules and correspond to the active portion of molecular electronic device 110. In operation, the state of molecular electronic device 110 may be changed by applying a relatively high state-changing voltage across wires 112, 114. The magnitude of the state-changing voltage is sufficient to oxidize or reduce switch molecules 118. Switch molecules 118 may include a redox pair of molecular species that cooperate to balance charge such that when one of the molecular species is oxidized (or reduced), the other molecular species is reduced (or oxidized). In operation, in one example, one molecular species may be reduced and the associated molecular species (the other half of the redox pair) may be oxidized. In another example, one molecular species may be reduced and one of the wires 112, 114 may be oxidized. In a third example, one molecular species may be oxidized and one of the wires 112, 114 may be reduced. In a fourth example, one wire may be oxidized and an oxide associated with the other wire may be reduced. In each of these examples, oxidation or reduction affects the tunneling distance or the tunneling barrier height between the two wires, thereby exponentially altering the rate of charge transport across the wire junction. This electronic functionality serves as the basis for operating molecular electronic device 10 as an electrical switch.

Additional details regarding the general features of molecular electronic device 110 may be obtained from U.S. Pat. No. 6,128,214, which is incorporated herein by reference.

Depending upon the molecules or materials selected for molecular layer 16, molecular electronic device 110 may exhibit any one of a variety of different electrical switching functions that may be used to controllably connect or disconnect bottom wire layer 112 and top wire layer 114. The molecular electronic device may be singly configurable or reconfigurable. In singly configurable embodiments, the initial state of molecular electronic device 110 may be open or closed. By electrically biasing molecular electronic device 110 beyond a particular threshold voltage, the active material or molecules 118 may be oxidized or reduced to permanently reverse the initial state of the device and, thereby, irreversibly close or open the switching state of the device. In reconfigurable embodiments, the switching device may be opened and closed multiple times by cycling the polarity and the magnitude of the applied voltage beyond appropriate threshold values that are selected to reversibly oxidize and reduce the active material or molecules 118.

In general, the type of electrical connection formed between bottom wire layer 112 and top wire layer 114 depends upon the materials from which wire layers 112, 114 and molecular layer 116 are formed. Table 1 identifies the various types of electrical switching functions that may be obtained from different device material combinations.

TABLE 1

| | Wire Layer Materials | | | | |
|---|---|---|---|---|---|
| Device Type | Metal—Metal (same) | Metal—Metal (different) | Metal–Semiconductor | Semiconductor—Semiconductor (pn junction) | Semiconductor—Semiconductor (heterojunction) |
| Resistor | X | X | X | | |
| Tunneling Resistor | X | X | X | | |
| Resonant Tunneling | X | X | X | | |

TABLE 1-continued

Wire Layer Materials

| Device Type | Metal—Metal (same) | Metal—Metal (different) | Metal–Semiconductor | Semiconductor—Semiconductor (pn junction) | Semiconductor—Semiconductor (heterojunction) |
|---|---|---|---|---|---|
| Resistor | | | | | |
| Diode | | X | X | X | X |
| Tunneling Diode | | X | X | X | |
| Resonant Tunneling Diode | | X | X | X | X |
| Battery | | X | X | | X |

Figure 8:
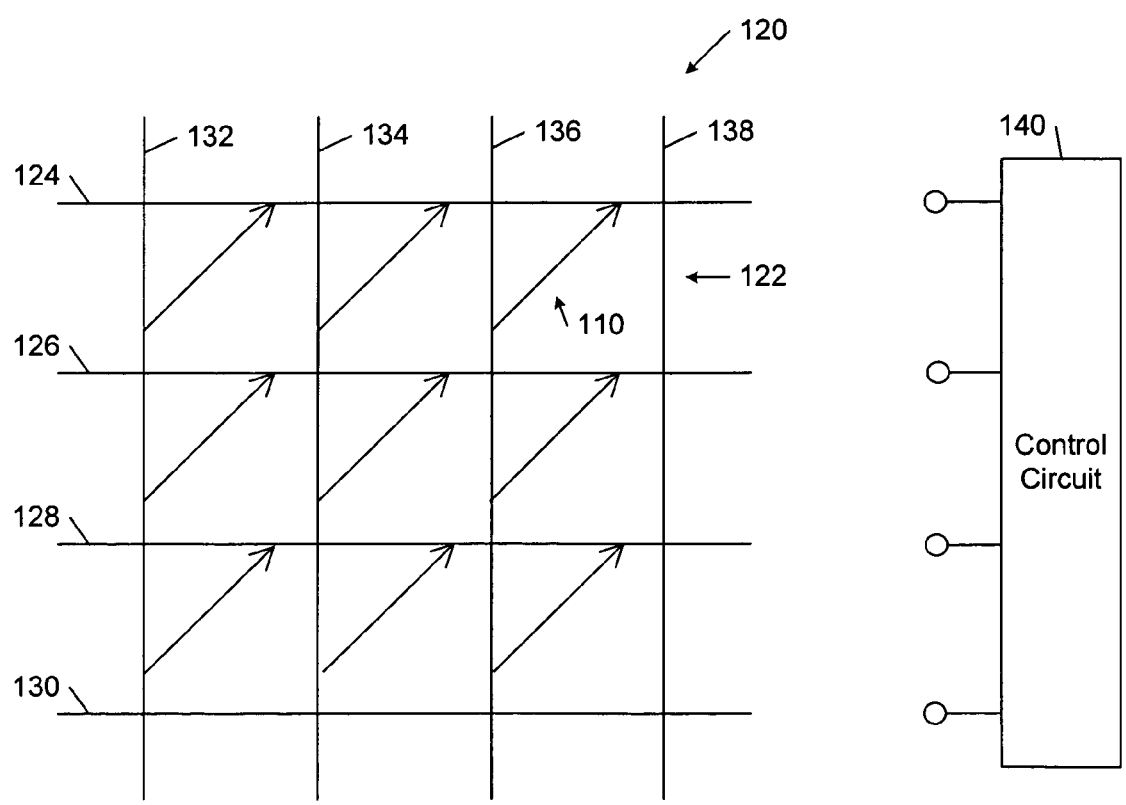
FIG. 8 is a circuit diagram of an embodiment of a resistive crossbar memory structure that includes an array of molecular electronic devices fabricated by an imprint lithographic process.

Referring to FIG. 8, in one embodiment, molecular electronic device 110 may be incorporated into a resistive molecular wire crossbar memory 120 that includes a plurality of memory cells 122 that are arranged in multiple rows and multiple columns. Each memory cell 122 includes a molecular electronic device 110 that is coupled between a respective bottom wire line 124, 126, 128, 130 and a respective top wire line 132, 134, 136, 138. The voltage across a memory cell is determined by the voltages applied to the bottom wire line and the top wire line between which the memory cell is coupled. A control circuit 140 is configured to address (or select), program information into, and read information from one or more memory cells 122 within memory cell array 120. Molecular electronic devices 110 are activated by electrochemical reduction or oxidation of the molecules 118 that are sandwiched between the bottom and top wire lines. In this embodiment, the molecules of molecular layer 116 are selected to have a large hysteresis in the voltammogram so that a switch may be oxidized at a relatively high voltage and its status may be read at a lower voltage. When a switch is (electrochemically) closed, the resistance between connecting wires is low, which may correspond to a logic level of "1". When the switch is opened, the resistance is high, which may correspond to a logic level of "0". Further details regarding the operation of a resistive molecular crossbar memory may be obtained from U.S. Pat. No. 6,128,214.

Other embodiments are within the scope of the claims.

For example, in addition to a resistive molecular wire crossbar memory, other molecular wire crossbar memory embodiments may include an array of molecular electronic devices that are configured to provide any one of the other switching functions identified in Table 1. In addition, the above-described molecular electronic devices may be implemented in a circuit designed to perform one or more logic (as opposed to memory) functions.

In addition, the motive forces that are generated between the mask alignment marks and the substrate alignment marks in the above-described embodiments correspond to electrostatic capacitive coupling forces. In other embodiments, the motive forces may be generated in different ways. For example, in some embodiments, the motive force may correspond to a magnetic force that is generated between one or more mask alignment marks exhibiting a first magnetic polarity and one or more corresponding substrate alignment marks exhibiting a second magnetic polarity opposite to the first magnetic polarity.

Still other embodiments are within the scope of the claims.

What is claimed is:

1. A lithographic method, comprising:
    aligning a substrate and a lithographic mask based at least in part on a motive force caused by capacitive coupling between a substrate alignment mark on the substrate and a mask alignment mark on the lithographic mask inducing movement of at least one of the substrate and the lithographic mask into mutual alignment.

2. The method of claim 1, wherein aligning comprises generating the motive force by applying an electric potential across the substrate alignment mark and the mask alignment mark.

3. The method of claim 1, wherein the motive force is substantially greater than a frictional force between the substrate and the lithographic mask resisting movement of the substrate and the lithographic mask into mutual alignment.

4. The method of claim 1, further comprising moving the substrate and the lithographic mask into coarse mutual alignment before aligning the substrate and the lithographic mask based at least in part on the motive force.

5. The method of claim 4, wherein the substrate and the lithographic mask are moved into coarse mutual alignment in accordance with an optical alignment process.

6. The method of claim 1, further comprising subsequently aligning the substrate and the lithographic mask based at least in part on a second motive force between a second substrate alignment mark on the lithographic mask and a second mask alignment mark on the lithographic mask, the second motive force inducing movement of the substrate and the lithographic mask into greater mutual alignment.

7. The method of claim 6, wherein the motive force between the first substrate alignment mark and the first mask alignment mark is greater than the second motive force.

8. The method of claim 1, further comprising urging the lithographic mask into a film disposed on the substrate to transfer a relief pattern to the film.

9. The method of claim 8, further comprising removing thinned regions of the transferred relief pattern.

10. A lithographic system, comprising:
    a capacitive coupling based alignment system electrically connected to a substrate alignment mark on a substrate and a mask alignment mark on a lithographic mask and configured to generate between the substrate alignment mark and the mask alignment mark a motive force inducing movement of at least one of the substrate and the lithographic mask into mutual alignment.

11. The system of claim 10, wherein the capacitive coupling based alignment system is configured to apply an electric potential across the substrate alignment mark and the mask alignment mark.

12. The system of claim 10, wherein the motive force generated by the capacitive coupling alignment system is substantially greater than a frictional force between the substrate and the lithographic mask resisting movement of the substrate and the lithographic mask into mutual alignment.

13. The system of claim 10, further comprising moving the substrate and the lithographic mask into coarse mutual alignment before generating the motive force.

14. The system of claim 13, further comprising an optical alignment system configured to move the substrate and the lithographic mask into coarse mutual alignment.

15. The system of claim 10, wherein the capacitive coupling based alignment system is configured to subsequently generate between a second substrate alignment mark on the lithographic mask and a second mask alignment mark on the lithographic mask a second motive force inducing movement of the substrate and the lithographic mask into greater mutual alignment.

16. The system of claim 15, wherein the motive force generated by the capacitive coupling based alignment system between the first substrate alignment mark and the first mask alignment mark is greater than the second motive force.

17. The system of claim 10, further comprising a positioner configured to urge the lithographic mask into a film disposed on the substrate to transfer a relief pattern to the film.

18. The system of claim 10, wherein a capacitive coupling region of the mask alignment mark is larger than a capacitive coupling region of the substrate alignment mark by a factor of at least 1.5.

19. The system of claim 18, wherein the capacitive coupling region of the mask alignment mark is larger than the capacitive coupling region of the substrate alignment mark by a factor of at least 10.

20. The system of claim 10, wherein a capacitive coupling region of the mask alignment mark has a length dimension on the order of about 50 nm along a plane parallel to a surface relief pattern of said mask, and a capacitive coupling region of the substrate alignment mark has a length dimension on the order of about 5 nm along a plane parallel to the surface relief pattern.

21. A lithographic system, comprising:

a capacitive coupling based alignment system electrically connected to a substrate alignment mark on a substrate and a mask alignment mark on a lithographic mask and configured to generate between the substrate alignment mark and the mask alignment mark a motive force inducing movement of at least one of the substrate and the lithographic mask into mutual alignment and further comprising:

a first set of multiple mask alignment marks each comprising a respective electrically conducting element having a capacitive coupling region arranged for capacitive coupling with a corresponding alignment mark on the substrate; and a second set of multiple substrate alignment marks each comprising a respective electrically conducting element having a capacitive coupling region arranged for capacitive coupling with a corresponding alignment mark on the mask;

wherein the capacitive coupling regions of the alignment marks of the first set have respective capacitive coupling areas within a first areal value range, and the capacitive coupling regions of the alignment marks of the second set have respective capacitive coupling areas within a second areal value range different from the first areal value range.

22. The system of claim 21, wherein the capacitive coupling regions of the alignment marks of the first set are electrically connected together, and the capacitive coupling regions of the alignment marks of the second set are electrically connected together.

23. The system of claim 22, wherein the capacitive coupling regions of the alignment marks of the first set are electrically disconnected from the capacitive coupling regions of the alignment marks of the second set.

24. The system of claim 10, further comprising a clutch which is selectively disengaged to allow said movement in response to said motive force.

\* \* \* \* \*